US010923431B2

(12) United States Patent
Hu et al.

(10) Patent No.: US 10,923,431 B2
(45) Date of Patent: Feb. 16, 2021

(54) METHOD FOR FORMING A 3D IC ARCHITECTURE INCLUDING FORMING A FIRST DIE ON A FIRST SIDE OF A FIRST INTERCONNECT STRUCTURE AND A SECOND DIE IN AN OPENING FORMED IN A SECOND SIDE

(71) Applicant: Taiwan Semiconductor Manufacturing Company, Ltd., Hsinchu (TW)

(72) Inventors: Hsien-Pin Hu, Zhubei (TW); Chen-Hua Yu, Hsinchu (TW); Ming-Fa Chen, Taichung (TW); Jing-Cheng Lin, Hsinchu (TW); Jiun Ren Lai, Zhubei (TW); Yung-Chi Lin, Su-Lin (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 16/417,282

(22) Filed: May 20, 2019

(65) Prior Publication Data
US 2019/0273046 A1    Sep. 5, 2019

Related U.S. Application Data

(62) Division of application No. 12/774,558, filed on May 5, 2010, now Pat. No. 10,297,550.
(Continued)

(51) Int. Cl.
*H01L 23/538* (2006.01)
*H01L 23/498* (2006.01)
(Continued)

(52) U.S. Cl.
CPC ........ *H01L 23/5389* (2013.01); *H01L 21/563* (2013.01); *H01L 21/6835* (2013.01); *H01L 23/147* (2013.01); *H01L 23/3121* (2013.01); *H01L 23/49816* (2013.01); *H01L 23/49822* (2013.01); *H01L 23/49827* (2013.01); *H01L 24/81* (2013.01); *H01L 24/97* (2013.01); *H01L 24/16* (2013.01); *H01L 25/0652* (2013.01); *H01L 2221/68345* (2013.01); *H01L 2224/73203* (2013.01); *H01L 2224/73204* (2013.01); *H01L 2224/81001* (2013.01);
(Continued)

(58) Field of Classification Search
CPC ......... H01L 23/49822; H01L 23/49827; H01L 23/49833; H01L 23/5389
See application file for complete search history.

(56) References Cited

U.S. PATENT DOCUMENTS

| 4,811,082 A | 3/1989 | Jacobs et al. |
| 4,990,462 A | 2/1991 | Sliwa, Jr. |

(Continued)

*Primary Examiner* — Anh D Mai
(74) *Attorney, Agent, or Firm* — Slater Matsil, LLP

(57) ABSTRACT

A device includes an interposer, which includes a substrate having a top surface. An interconnect structure is formed over the top surface of the substrate, wherein the interconnect structure includes at least one dielectric layer, and metal features in the at least one dielectric layer. A plurality of through-substrate vias (TSVs) is in the substrate and electrically coupled to the interconnect structure. A first die is over and bonded onto the interposer. A second die is bonded onto the interposer, wherein the second die is under the interconnect structure.

20 Claims, 25 Drawing Sheets

Related U.S. Application Data

(60) Provisional application No. 61/301,855, filed on Feb. 5, 2010.

(51) Int. Cl.
  *H01L 21/56* (2006.01)
  *H01L 21/683* (2006.01)
  *H01L 23/14* (2006.01)
  *H01L 23/31* (2006.01)
  *H01L 23/00* (2006.01)
  H01L 25/065 (2006.01)

(52) U.S. Cl.
  CPC .............. *H01L 2224/81801* (2013.01); *H01L 2224/97* (2013.01); *H01L 2924/014* (2013.01); *H01L 2924/01013* (2013.01); *H01L 2924/01029* (2013.01); *H01L 2924/01032* (2013.01); *H01L 2924/01033* (2013.01); *H01L 2924/01047* (2013.01); *H01L 2924/01074* (2013.01); *H01L 2924/01078* (2013.01); *H01L 2924/01079* (2013.01); *H01L 2924/01082* (2013.01); *H01L 2924/01322* (2013.01); *H01L 2924/10329* (2013.01); *H01L 2924/14* (2013.01); *H01L 2924/1517* (2013.01); *H01L 2924/15153* (2013.01); *H01L 2924/181* (2013.01); *H01L 2924/19041* (2013.01)

(56) References Cited

U.S. PATENT DOCUMENTS

| | | |
|---|---|---|
| 5,075,253 A | 12/1991 | Sliwa, Jr. |
| 5,380,681 A | 1/1995 | Hsu |
| 5,391,917 A | 2/1995 | Gilmour et al. |
| 5,481,133 A | 1/1996 | Hsu |
| 5,510,298 A | 4/1996 | Redwine |
| 5,600,530 A | 2/1997 | Smith |
| 5,767,001 A | 6/1998 | Bertagnolli et al. |
| 5,835,334 A | 11/1998 | McMillin et al. |
| 5,986,874 A | 11/1999 | Ross et al. |
| 5,998,292 A | 12/1999 | Black et al. |
| 6,002,177 A | 12/1999 | Gaynes et al. |
| 6,127,736 A | 10/2000 | Akram |
| 6,184,060 B1 | 2/2001 | Siniaguine |
| 6,187,678 B1 | 2/2001 | Gaynes et al. |
| 6,229,216 B1 | 5/2001 | Ma et al. |
| 6,236,115 B1 | 5/2001 | Gaynes et al. |
| 6,271,059 B1 | 8/2001 | Bertin et al. |
| 6,274,821 B1 | 8/2001 | Echigo et al. |
| 6,279,815 B1 | 8/2001 | Correia et al. |
| 6,322,903 B1 | 11/2001 | Siniaguine et al. |
| 6,355,501 B1 | 3/2002 | Fung et al. |
| 6,430,030 B1 | 8/2002 | Farooq et al. |
| 6,434,016 B2 | 8/2002 | Zeng et al. |
| 6,448,168 B1 | 9/2002 | Rao et al. |
| 6,448,661 B1 | 9/2002 | Kim et al. |
| 6,461,895 B1 | 10/2002 | Liang et al. |
| 6,465,084 B1 | 10/2002 | Curcio et al. |
| 6,465,892 B1 | 10/2002 | Suga |
| 6,472,293 B1 | 10/2002 | Suga |
| 6,538,333 B2 | 3/2003 | Kong |
| 6,562,653 B1 | 5/2003 | Ma et al. |
| 6,570,248 B1 | 5/2003 | Ahn et al. |
| 6,599,778 B2 | 7/2003 | Pogge et al. |
| 6,600,222 B1 | 7/2003 | Levardo |
| 6,607,938 B2 | 8/2003 | Kwon et al. |
| 6,639,303 B2 | 10/2003 | Siniaguine |
| 6,661,085 B2 | 12/2003 | Kellar et al. |
| 6,664,129 B2 | 12/2003 | Siniaguine |
| 6,671,947 B2 | 1/2004 | Bohr |
| 6,693,361 B1 | 2/2004 | Siniaguine et al. |
| 6,740,582 B2 | 5/2004 | Siniaguine |
| 6,762,076 B2 | 7/2004 | Kim et al. |
| 6,779,783 B2 | 8/2004 | Kung et al. |
| 6,790,748 B2 | 9/2004 | Kim et al. |
| 6,800,930 B2 | 10/2004 | Jackson et al. |
| 6,841,883 B1 | 1/2005 | Farnworth et al. |
| 6,882,030 B2 | 4/2005 | Siniaguine |
| 6,887,769 B2 | 5/2005 | Kellar et al. |
| 6,908,565 B2 | 6/2005 | Kim et al. |
| 6,908,785 B2 | 6/2005 | Kim |
| 6,924,551 B2 | 8/2005 | Rumer et al. |
| 6,943,067 B2 | 9/2005 | Greenlaw |
| 6,946,384 B2 | 9/2005 | Kloster et al. |
| 6,962,867 B2 | 11/2005 | Jackson et al. |
| 6,962,872 B2 | 11/2005 | Chudzik et al. |
| 6,975,016 B2 | 12/2005 | Kellar et al. |
| 7,030,481 B2 | 4/2006 | Chudzik et al. |
| 7,037,804 B2 | 5/2006 | Kellar et al. |
| 7,049,170 B2 | 5/2006 | Savastiouk et al. |
| 7,056,807 B2 | 6/2006 | Kellar et al. |
| 7,060,601 B2 | 6/2006 | Savastiouk et al. |
| 7,071,546 B2 | 7/2006 | Fey et al. |
| 7,087,538 B2 | 8/2006 | Staines et al. |
| 7,111,149 B2 | 9/2006 | Eilert |
| 7,122,912 B2 | 10/2006 | Matsui |
| 7,151,009 B2 | 12/2006 | Kim et al. |
| 7,157,787 B2 | 1/2007 | Kim et al. |
| 7,193,308 B2 | 3/2007 | Matsui |
| 7,215,033 B2 | 5/2007 | Lee et al. |
| 7,241,641 B2 | 7/2007 | Savastiouk et al. |
| 7,262,495 B2 | 8/2007 | Chen et al. |
| 7,276,799 B2 | 10/2007 | Lee et al. |
| 7,279,795 B2 | 10/2007 | Periaman et al. |
| 7,297,574 B2 | 11/2007 | Thomas et al. |
| 7,307,005 B2 | 12/2007 | Kobrinsky et al. |
| 7,317,256 B2 | 1/2008 | Williams et al. |
| 7,320,928 B2 | 1/2008 | Kloster et al. |
| 7,335,972 B2 | 2/2008 | Chanchani |
| 7,345,350 B2 | 3/2008 | Sinha |
| 7,355,273 B2 | 4/2008 | Jackson et al. |
| 7,402,442 B2 | 7/2008 | Condorelli et al. |
| 7,402,515 B2 | 7/2008 | Arana et al. |
| 7,410,884 B2 | 8/2008 | Ramanathan et al. |
| 7,432,592 B2 | 10/2008 | Shi et al. |
| 7,494,845 B2 | 2/2009 | Hwang et al. |
| 7,528,494 B2 | 5/2009 | Furukawa et al. |
| 7,531,890 B2 | 5/2009 | Kim |
| 7,552,531 B2 | 6/2009 | Takada et al. |
| 7,557,597 B2 | 7/2009 | Anderson et al. |
| 7,573,136 B2 | 8/2009 | Jiang et al. |
| 7,576,435 B2 | 8/2009 | Chao |
| 7,834,450 B2 | 11/2010 | Kang |
| 8,093,711 B2 | 1/2012 | Zudock et al. |
| 8,143,097 B2 | 3/2012 | Chi et al. |
| 8,168,470 B2 | 5/2012 | Lin et al. |
| 8,557,684 B2 | 10/2013 | Wu et al. |
| 8,581,402 B2 | 11/2013 | Yu et al. |
| 8,643,148 B2 | 2/2014 | Lin et al. |
| 8,669,174 B2 | 3/2014 | Wu et al. |
| 8,674,513 B2 | 3/2014 | Yu et al. |
| 2004/0027781 A1 | 2/2004 | Anawa et al. |
| 2004/0262735 A1 | 12/2004 | Higashi et al. |
| 2006/0001179 A1 | 1/2006 | Fukase et al. |
| 2008/0303154 A1 | 12/2008 | Huang et al. |
| 2009/0309212 A1 | 12/2009 | Shim et al. |
| 2010/0090318 A1 | 4/2010 | Hsu et al. |
| 2010/0090319 A1 | 4/2010 | Hsu et al. |
| 2011/0024888 A1 | 2/2011 | Pagaila et al. |
| 2011/0193235 A1 | 8/2011 | Hu et al. |
| 2011/0254160 A1 | 10/2011 | Tsai et al. |
| 2011/0278721 A1 | 11/2011 | Choi et al. |

METHOD FOR FORMING A 3D IC ARCHITECTURE INCLUDING FORMING A FIRST DIE ON A FIRST SIDE OF A FIRST INTERCONNECT STRUCTURE AND A SECOND DIE IN AN OPENING FORMED IN A SECOND SIDE

CROSS-REFERENCE TO RELATED APPLICATIONS

This application is a divisional of U.S. patent application Ser. No. 12/774,558, filed on May 5, 2010, entitled "3DIC Architecture with Interposer for Bonding Dies," which application claims the benefit of U.S. Provisional Application No. 61/301,855 filed on Feb. 5, 2010, entitled "Logic Last 3DIC," which applications are hereby incorporated herein by reference.

TECHNICAL FIELD

This disclosure relates generally to integrated circuits, and more particularly to the formation of three-dimensional integrated circuits (3DICs) comprising interposers and the method of forming the same.

BACKGROUND

Since the invention of integrated circuits, the semiconductor industry has experienced continuous rapid growth due to constant improvements in the integration density of various electronic components (i.e., transistors, diodes, resistors, capacitors, etc.). For the most part, these improvements in integration density have come from repeated reductions in minimum feature size, allowing more components to be integrated into a given chip area.

These integration improvements are essentially two-dimensional (2D) in nature, in that the volume occupied by the integrated components is essentially on the surface of the semiconductor wafer. Although dramatic improvements in lithography have resulted in considerable improvements in 2D integrated circuit formation, there are physical limitations to the density that can be achieved in two dimensions. One of these limitations is the minimum size needed to make these components. Also, when more devices are put into one chip, more complex designs are required. An additional limitation comes from the significant increase in the number and length of interconnections between devices as the number of devices increases. When the number and length of interconnections increase, both circuit RC delay and power consumption increase.

Three-dimensional integrated circuits (3DICs) were thus formed, wherein two dies may be stacked, with through-silicon vias (TSVs) formed in one of the dies to connect the other die to a package substrate. The TSVs are often formed after the front-end-of-line (FEOL) process, in which devices, such as transistors, are formed, and possibly after the back-end-of-line (BEOL) process, in which the interconnect structures are formed. This may cause yield loss of the already formed dies. Further, since the TSVs are formed after the formation of integrated circuits, the cycle time for manufacturing is also prolonged.

SUMMARY

In accordance with one aspect, a device includes an interposer, which includes a substrate having a top surface. An interconnect structure is formed over the top surface of the substrate, wherein the interconnect structure includes at least one dielectric layer, and metal features in the at least one dielectric layer. A plurality of through-substrate vias (TSVs) is in the substrate and electrically coupled to the interconnect structure. A first die is over and bonded onto the interposer. A second die is bonded onto the interposer, wherein the second die is under the interconnect structure. Other embodiments are also disclosed.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative and do not limit the scope of the disclosure.

A novel three-dimensional integrated circuit (3DIC) and the method of forming the same are provided. The intermediate stages of manufacturing an embodiment are illustrated. The variations of the embodiment are discussed. Throughout the various views and illustrative embodiments, like reference numbers are used to designate like elements.

Figure 1A:
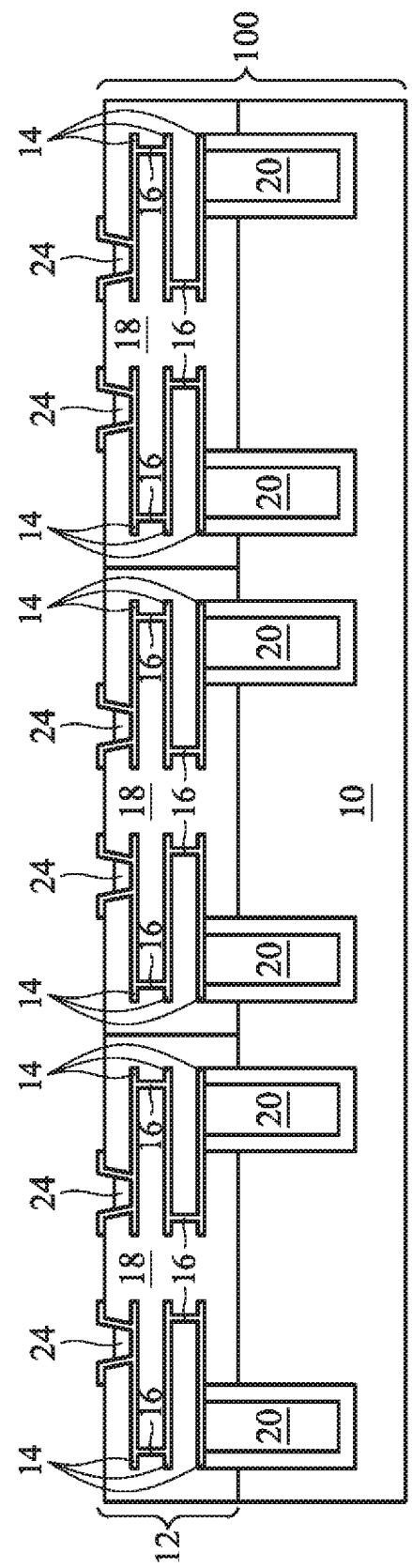
FIGS. 1A through 1I are cross-sectional views of intermediate stages in the manufacturing of a three-dimensional integrated circuit (3DIC) in accordance with various embodiments, wherein dies are bonded onto both sides of an interposer.

Referring to FIG. 1A, substrate 10 is provided. Throughout the description, substrate 10 and the corresponding interconnect structures 12 and 32 (not shown in FIG. 1A, please refer to FIG. 1D in combination are referred to as interposer wafer 100. Substrate 10 may be formed of a semiconductor material, such as silicon, silicon germanium, silicon carbide, gallium arsenide, or other commonly used semiconductor materials. Alternatively, substrate 10 is formed of a dielectric material. Interposer wafer 100 is substantially free from integrated circuit devices, including active devices, such as transistors and diodes. Furthermore, interposer wafer 100 may include, or may be free from, passive devices, such as capacitors, resistors, inductors, varactors, and/or the like.

Front-side interconnect structure 12 is formed over substrate 10. Interconnect structure 12 includes one or more dielectric layer 18, and metal lines 14 and vias 16 in dielectric layer(s) 18. Throughout the description, the side of interposer wafer 100 facing up in FIG. 1A is referred to as a front side and the side facing down is referred to as a backside. Metal lines 14 and vias 16 are referred to as front-side redistribution lines (RDLs). Further, through-substrate vias (TSVs) 20 are formed in substrate 10 to a predetermined depth, and may possibly penetrate some or all of dielectric layer(s) 18. TSVs 20 are electrically coupled to front-side RDLs 14/16.

Next, front-side (metal) bumps (or bond pads) 24 are formed on the front-side of interposer wafer 100 and are electrically coupled to TSVs 20 and RDLs 14/16. In an embodiment, front-side metal bumps 24 are solder bumps, such as eutectic solder bumps. In alternative embodiments, front-side bumps 24 are copper bumps or other metal bumps formed of gold, silver, nickel, tungsten, aluminum, and alloys thereof. Front-side bumps 24 may protrude the surface of interconnect structure 12.

Figure 1B:
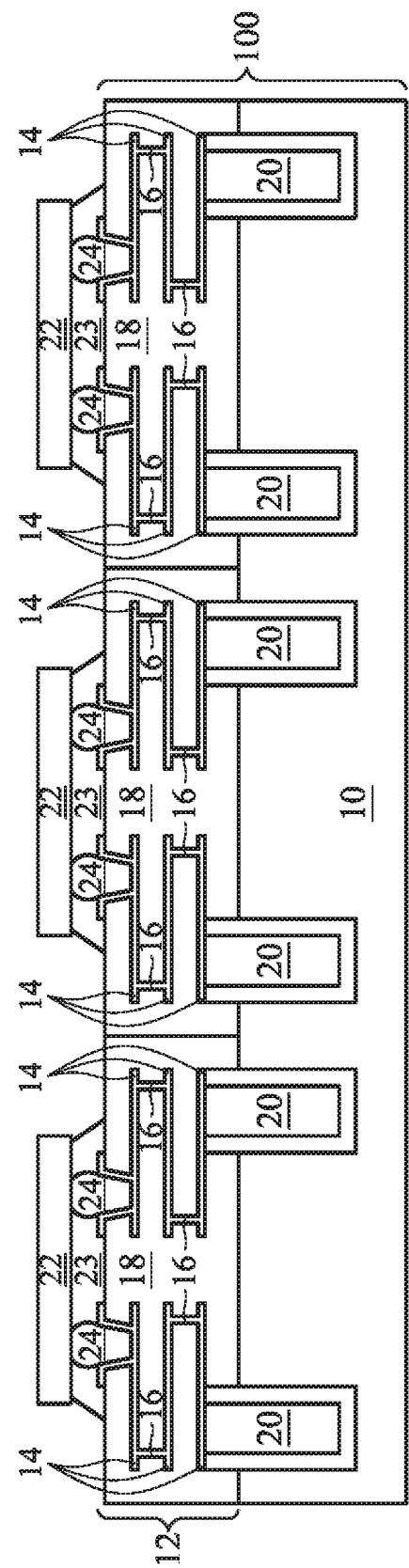

Referring to FIG. 1B, dies 22 are bonded to front-side bumps 24. Dies 22 may be device dies comprising integrated circuit devices, such as transistors, capacitors, inductors, resistors (not shown), and the like, therein. Further, dies 22 may be logic dies comprising core circuits, and may be, for example, center processing unit (CPU) dies. The bonding between dies 22 and bumps 24 may be a solder bonding or a direct metal-to-metal (such as a copper-to-copper) bonding. In alternative embodiments, dies 22 are not bonded at this time. Instead, dies 22 are bonded after the backside interconnect structure 32 (FIG. 1D) is formed, as will be discussed in detail hereinafter. Underfill 23 is dispensed into the gaps between dies 22 and interposer wafer 100 and is cured.

Figure 1C:
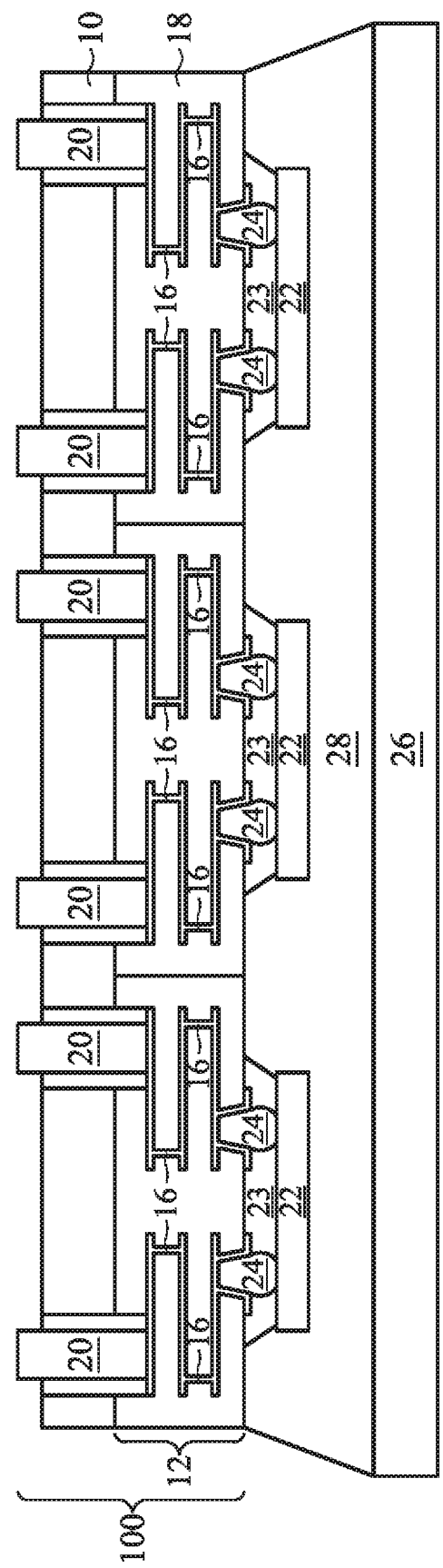

Referring to FIG. 1C, carrier 26, which may be a glass wafer, is bonded onto the front side of interposer wafer 100 through adhesive 28. Adhesive 28 may be an ultra-violet (UV) glue, or formed of other known adhesive materials. A wafer backside grinding is performed to thin substrate 10 from the backside, until TSVs 20 are exposed. An etch may be performed to further reduce the surface of substrate 10 so that TSVs 20 protrude out of the back surface of the remaining portion of substrate 10.

Figure 1D:
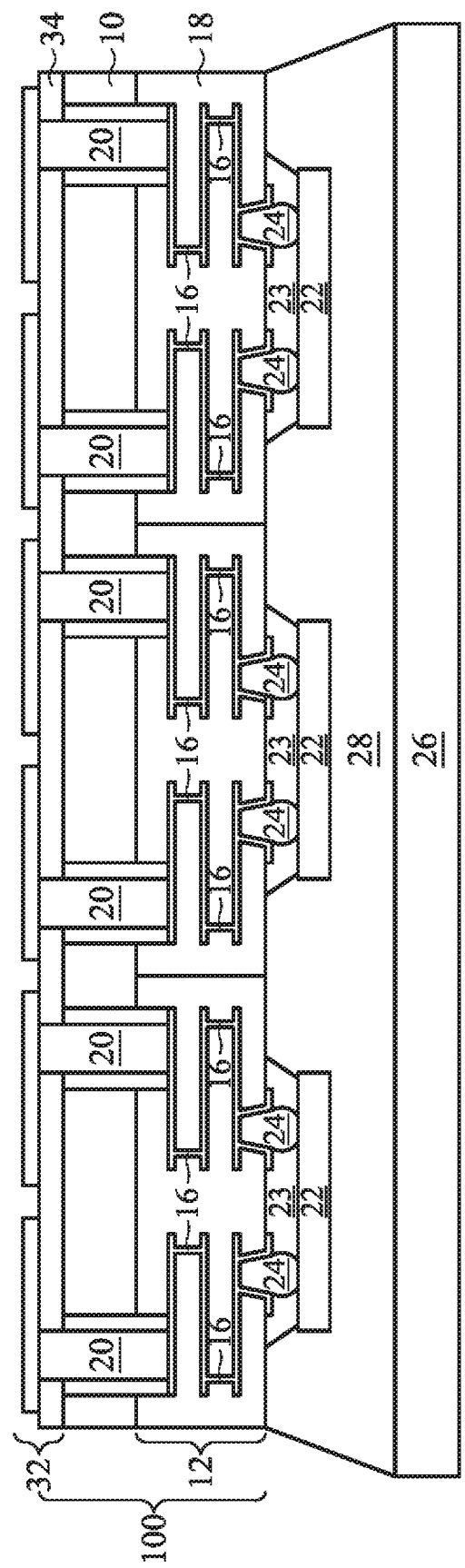
Figure 1E:
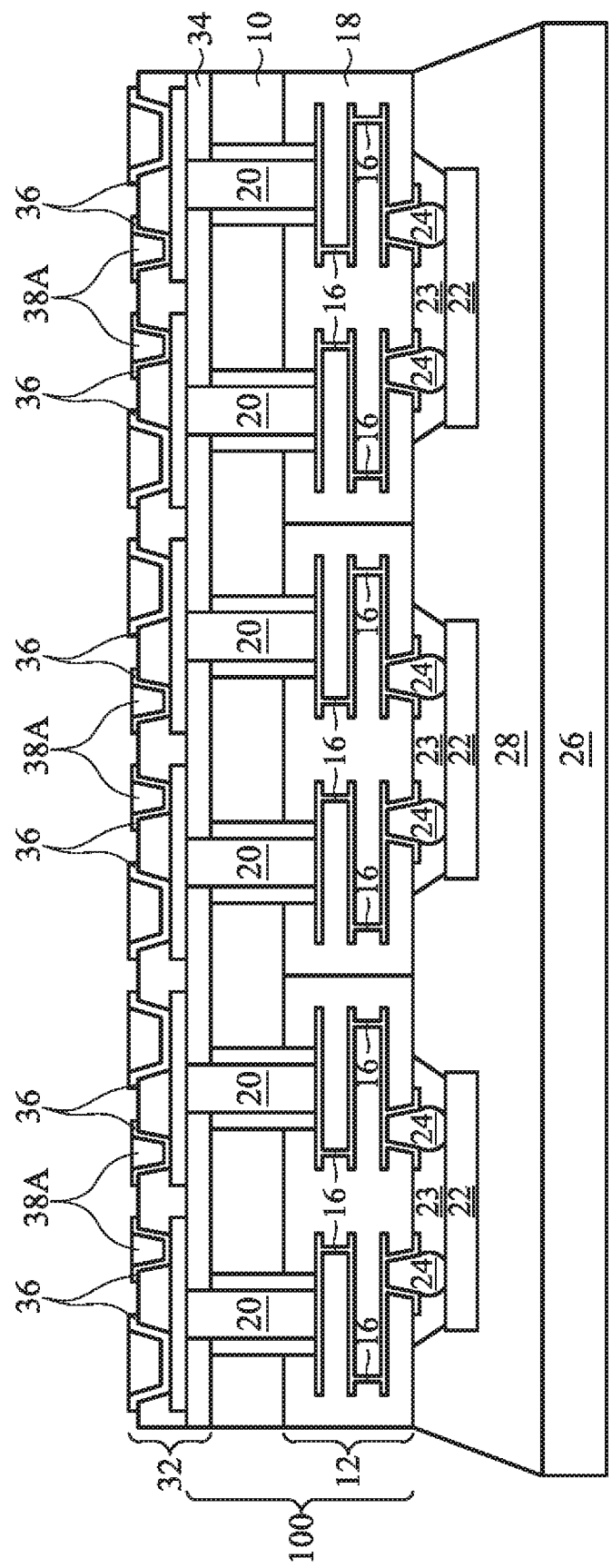

Next, as shown in FIGS. 1D and 1E, backside interconnect structure 32 is formed to connect to TSVs 20. In various embodiments, backside interconnect structure 32 may have a similar structure as front-side interconnect structure 12, and may include metal bumps and one or more layer of RDLs. For example, backside interconnect structure 32 may include dielectric layer 34 on substrate 10, wherein dielectric layer 34 may be a low-temperature polyimide layer, or may be formed of commonly known dielectric materials, such as spin-on glass, silicon oxide, silicon oxynitride, or the like. Dielectric layer 34 may also be formed using chemical vapor deposition (CVD). When the low-temperature polyimide is used, dielectric layer 34 also acts as a stress buffer layer. As shown in FIG. 1E, under-bump metallurgy (UBM) 36 and backside metal bumps 38A are then formed. Similarly, backside bumps 38A may be solder bumps such as eutectic solder bumps, copper bumps, or other metal bumps formed of gold, silver, nickel, tungsten, aluminum, and/or alloys thereof. In an exemplary embodiment, the formation of UBM 36 and bumps 38A may include blanket forming a UBM layer, forming a mask over the UBM layer with openings formed in the mask, plating bumps 38A in the openings, removing the mask, and performing a flash etching to remove the portions of the blanket UBM layer previously covered by the mask.

Figure 1F:
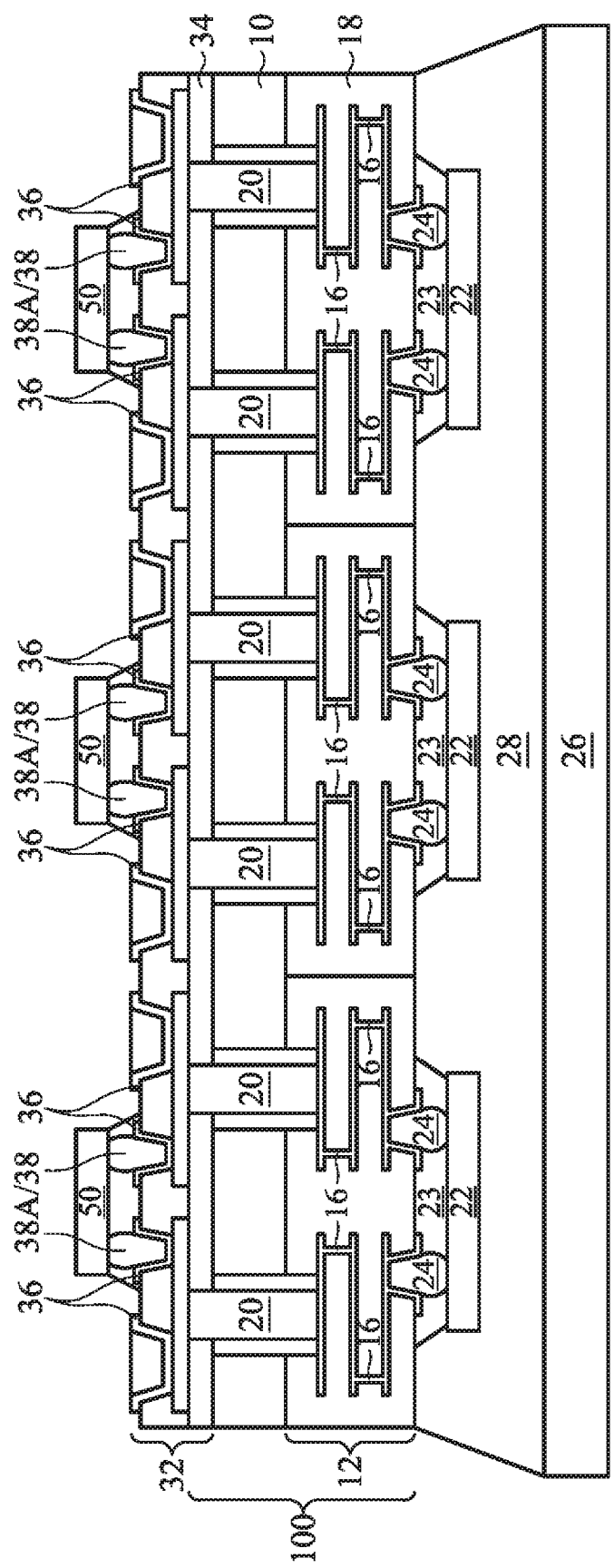

Referring to FIG. 1F, dies 50 are bonded to the backside of interposer wafer 100. Dies 50 may be electrically coupled to dies 22 through front-side interconnect structure 12, backside interconnect structure 32, and TSVs 20. Dies 22 and dies 50 may be different types of dies. For example, dies 22 may be logic dies, such as CPU dies, while dies 50 may be memory dies.

Figure 1G:
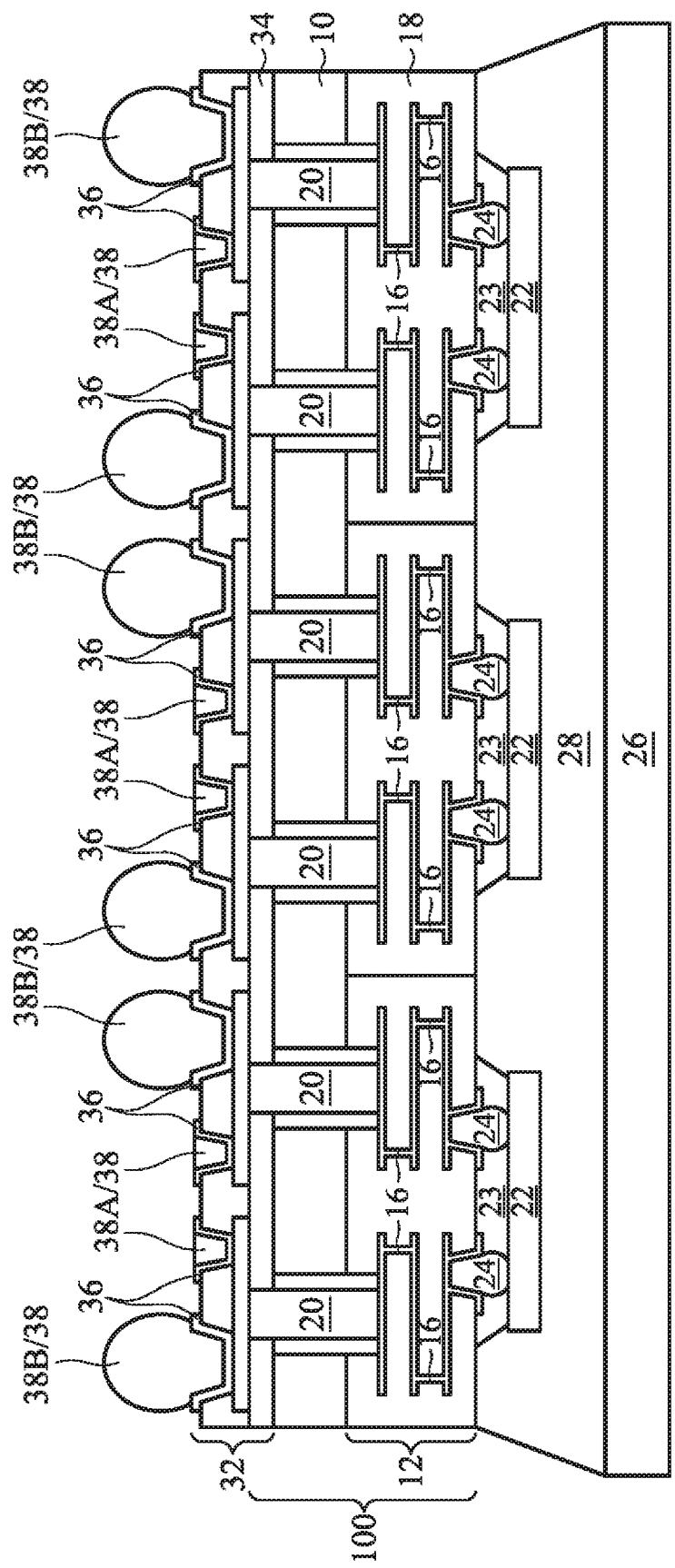
Figure 1H:
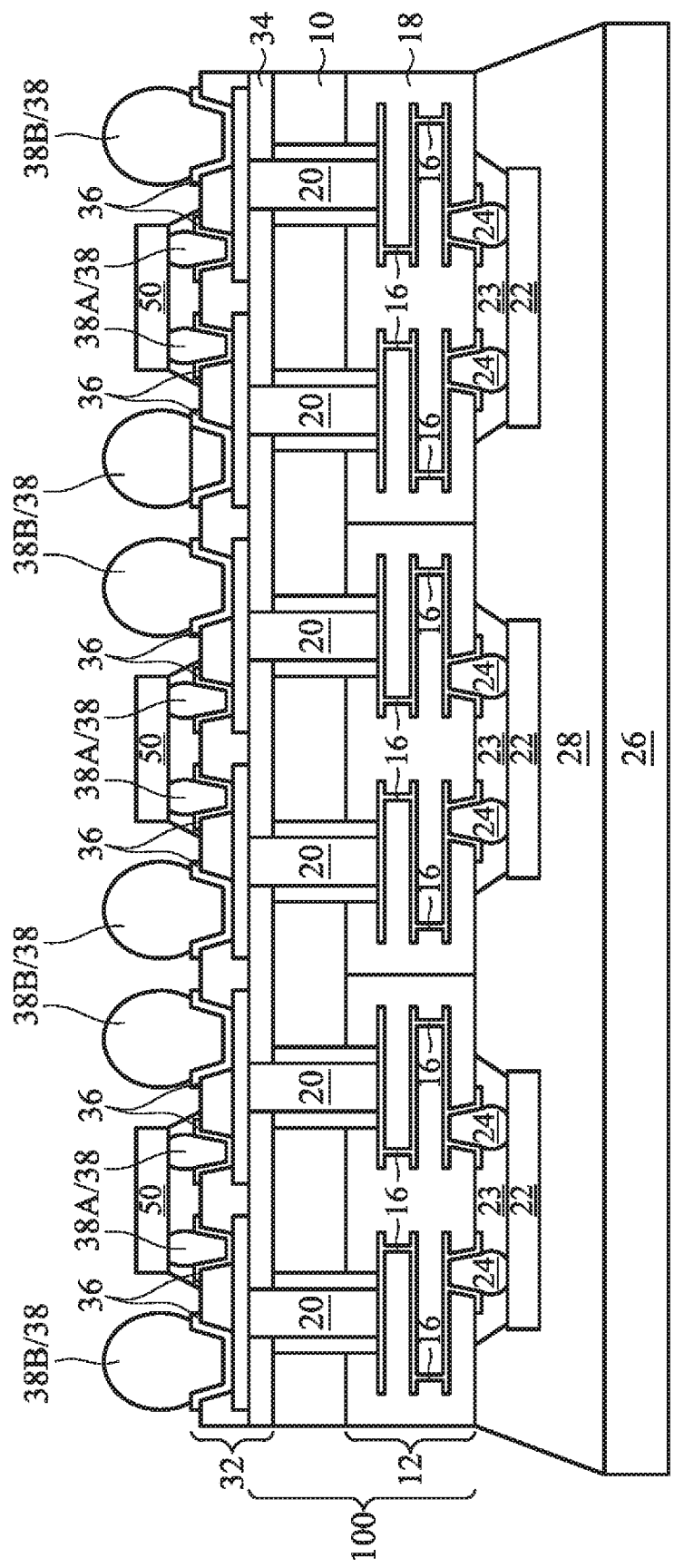

Next, as shown in FIG. 1H, large bumps 38B are formed on the backside of interposer wafer 100, and are electrically coupled to backside interconnect structure 32, TSVs 20 (not shown), and possibly dies 22 and 50. Large bumps 38B may be solder bumps formed of, for example, eutectic solder, although they may also be other types of bumps such as metal bonds. In alternative embodiments, the order for bonding dies 50 and forming large bumps 38B may be reversed. FIG. 1G illustrates an alternative embodiment, wherein large bumps 38B are formed first, followed by the bonding of dies 50 to form the structure shown in FIG. 1H. In these embodiments, bumps 38A (referred to as small bumps hereinafter) and large bumps 38B may be formed simultaneously using a one-step bump formation process.

Figure 1I:
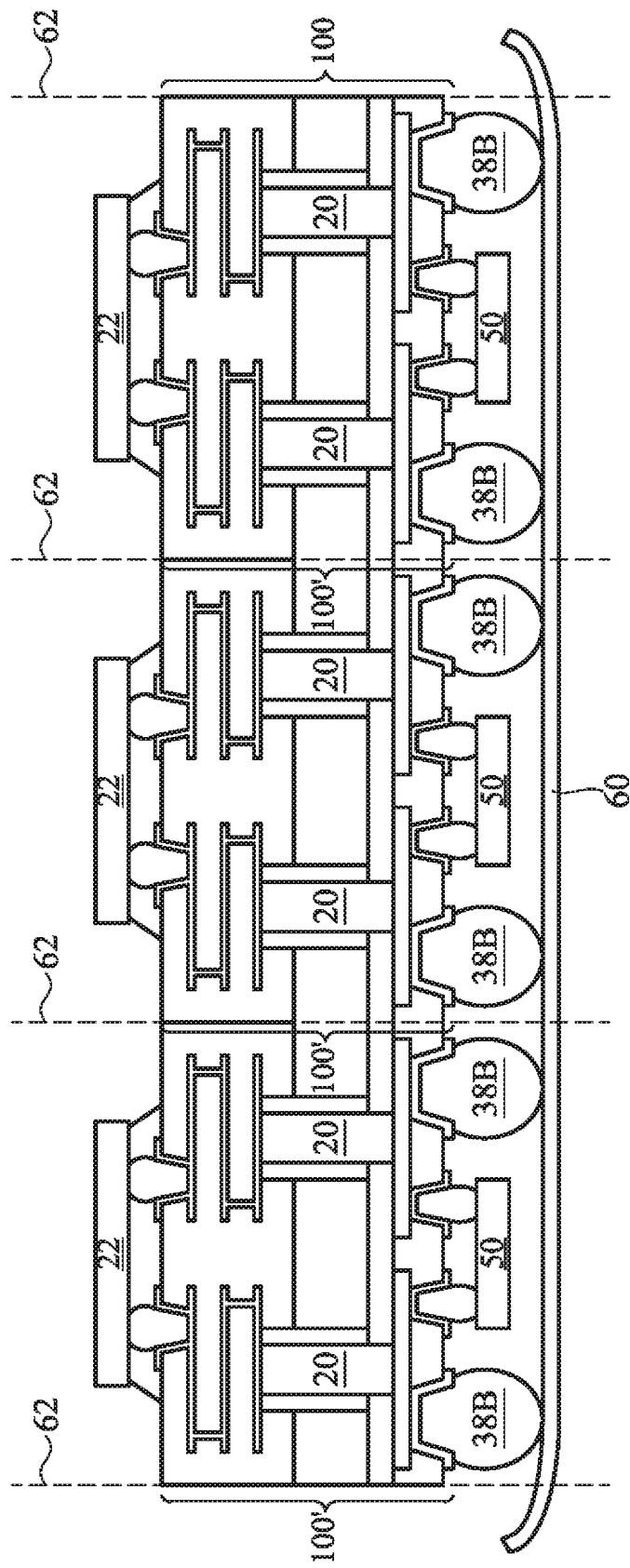

In FIG. 1I, carrier 26 as shown in FIG. 1H is de-bonded, for example, by exposing UV glue 28 to a UV light, causing it to lose its adhesive property. Dicing tape 60 is then adhered to the front side of the resulting structure. Next, a dicing is performed along lines 62 to separate interposer wafer 100 and dies 22 and 50 bonded on interposer wafer 100 into a plurality of dies. Each of the resulting dies includes one of interposer die 100', dies 22, and dies 50.

Figure 2A:
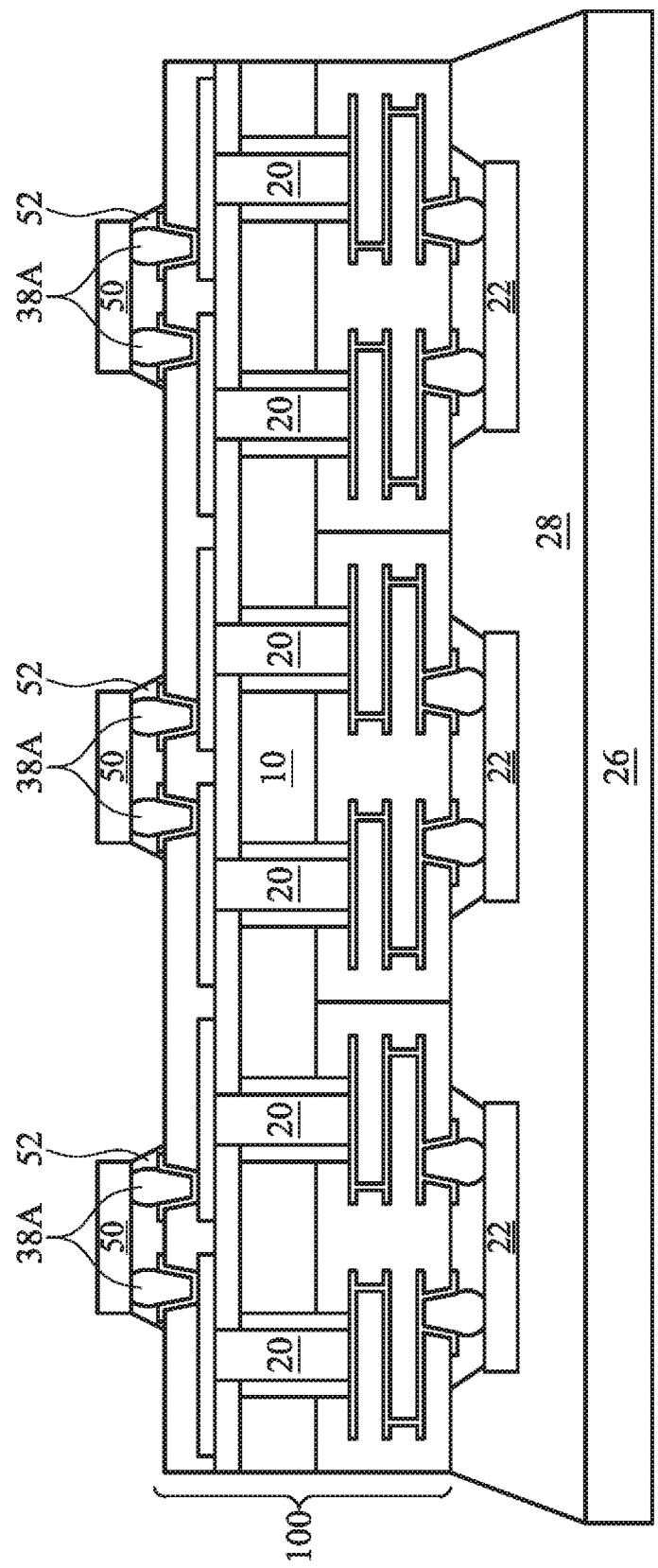
FIGS. 2A through 2D are cross-sectional views of intermediate stages in the manufacturing of a 3DIC in accordance with various embodiments, wherein a molding compound is used to form a planar surface for forming more large bumps.

In FIG. 1I, due to the existence of dies 50, portions of the backside of interposer wafer 100 are not available for forming large bumps 38B. In alternative embodiments shown in FIGS. 2A through 2D, however, more large bumps 38B may be formed since some of large bumps 38B (denoted as 38B' as in FIG. 2D) may be formed vertically aligned to, and overlapping, dies 50. A brief process flow is shown in FIGS. 2A through 2D. The initial process steps of this embodiment may be essentially the same as shown in FIGS. 1A through 1F, wherein small bumps 38A for bonding dies 50 are formed, while large bumps 38B are not formed at this time. Next, as shown in FIG. 2A, dies 50 are bonded to the backside of interposer wafer 100. Underfill 52 is filled into the gaps between dies 50 and interposer wafer 100, and is then cured.

Figure 2B:
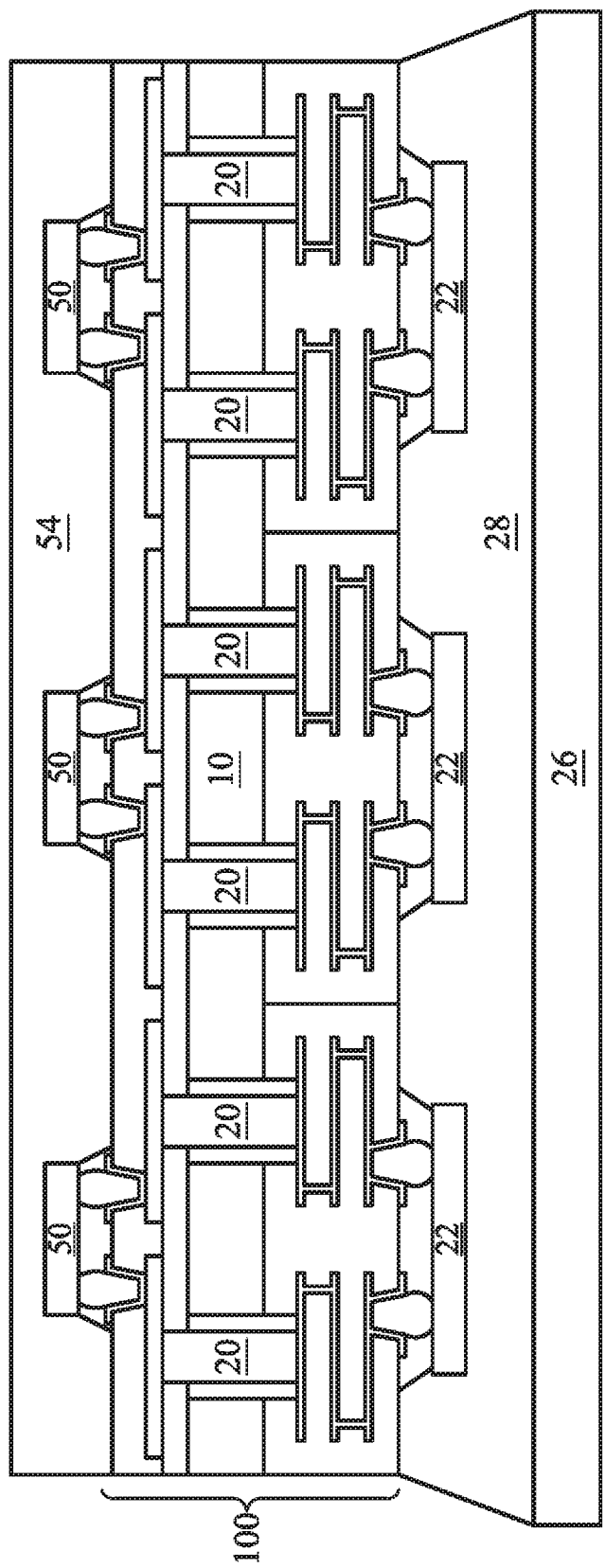
Figure 2C:
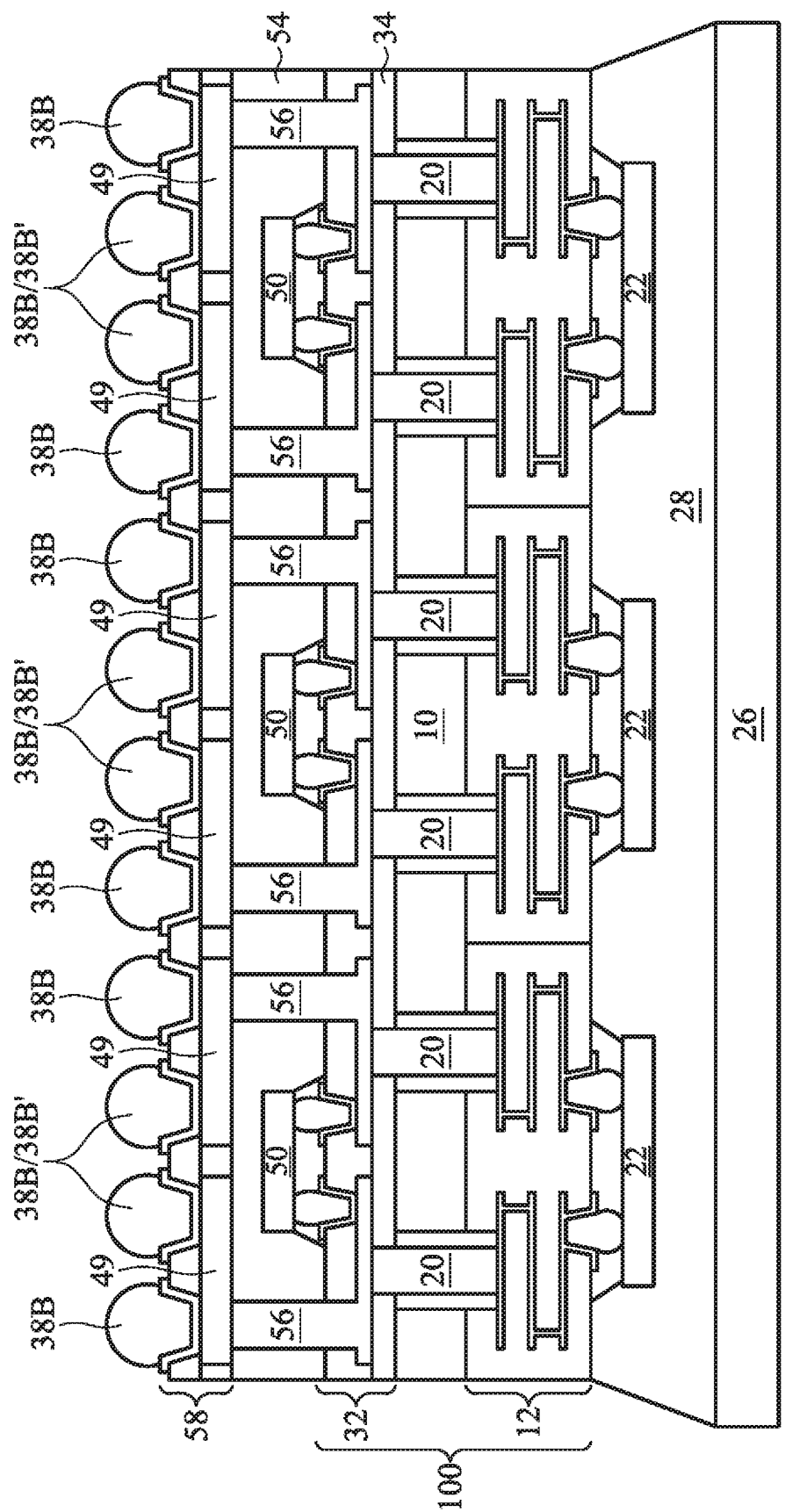

Referring to FIG. 2B, molding compound 54 (alternatively referred to as an encapsulating material) is molded onto dies 50 and interposer wafer 100. The top surface of molding compound 54 may be higher than, or level with, top surfaces of dies 50. Referring to FIG. 2C, deep vias 56 are formed to penetrate molding compound 54 and are electrically coupled to backside interconnect structure 32. Next, interconnect structure 58, which includes RDLs 49 electrically coupled to deep vias 56, is formed, followed by the formation of UBMs (not marked) and large bumps 38B. Again, a stress buffer layer, which may be formed of polyimide or solder resist, may be formed under the UBMs. It is observed that some of the large bumps 38B (marked as 38B') may be formed directly over, and vertically overlapping, portions of dies 50, and hence the number of large bumps 38B is increased over that of the structure shown in FIG. 1I.

Figure 2D:
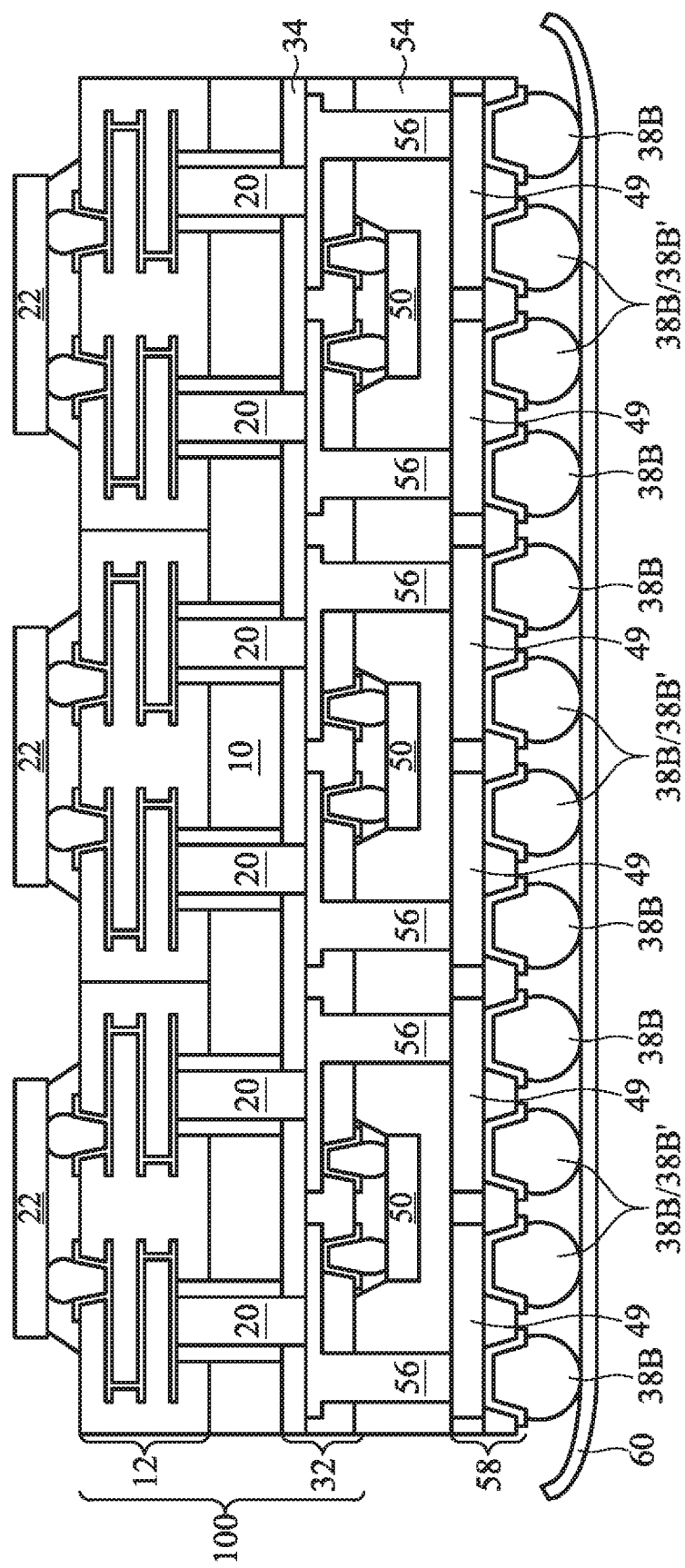

In FIG. 2D, carrier 26 is de-bonded. Dicing tape 60 is then adhered to the front side of the resulting structure. Next, a dicing is performed to separate interposer wafer 100 and dies 22 and 50 that are bonded onto interposer wafer 100 into a plurality of dies.

Figure 3A:
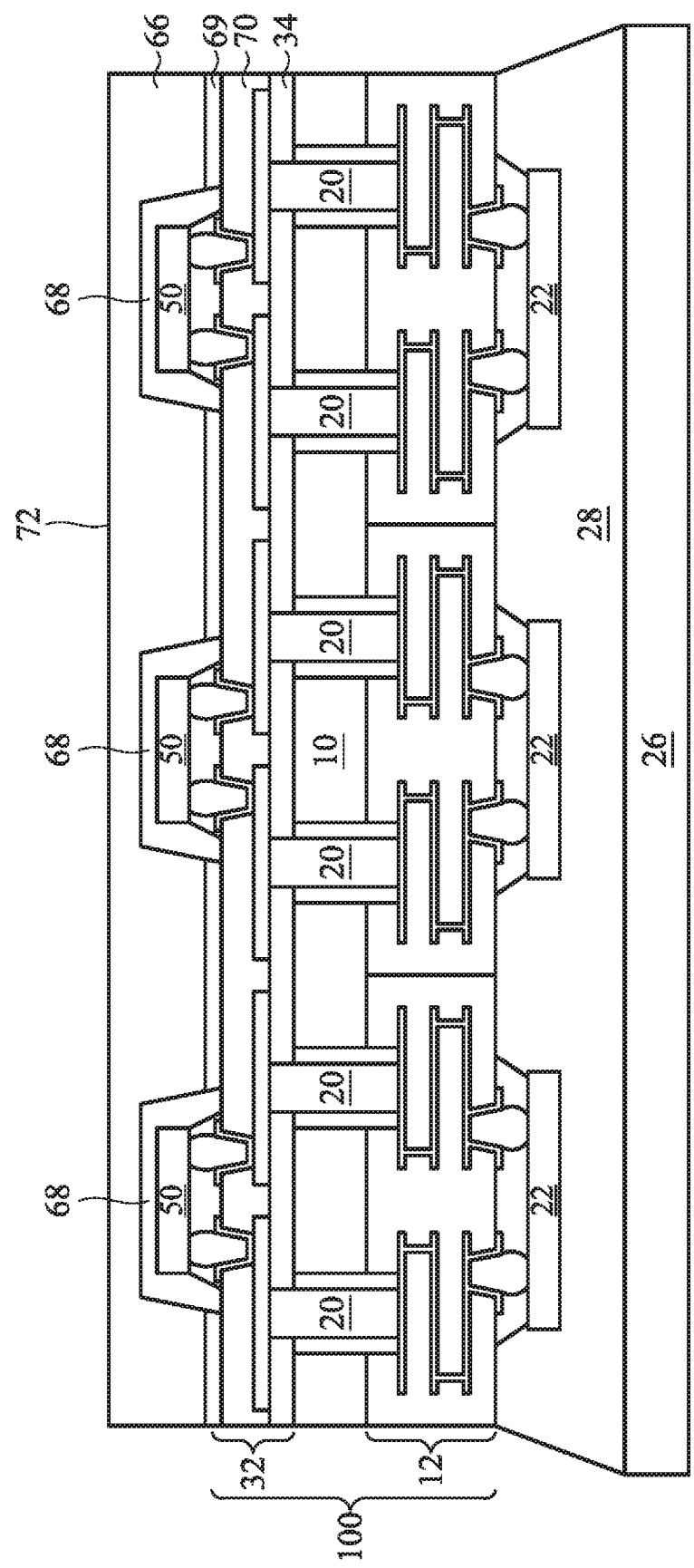
FIGS. 3A through 3C are cross-sectional views of intermediate stages in the manufacturing of a 3DIC in accordance with various embodiments, wherein a dummy silicon wafer is used to form a planar surface for forming more large bumps.
Figure 3B:
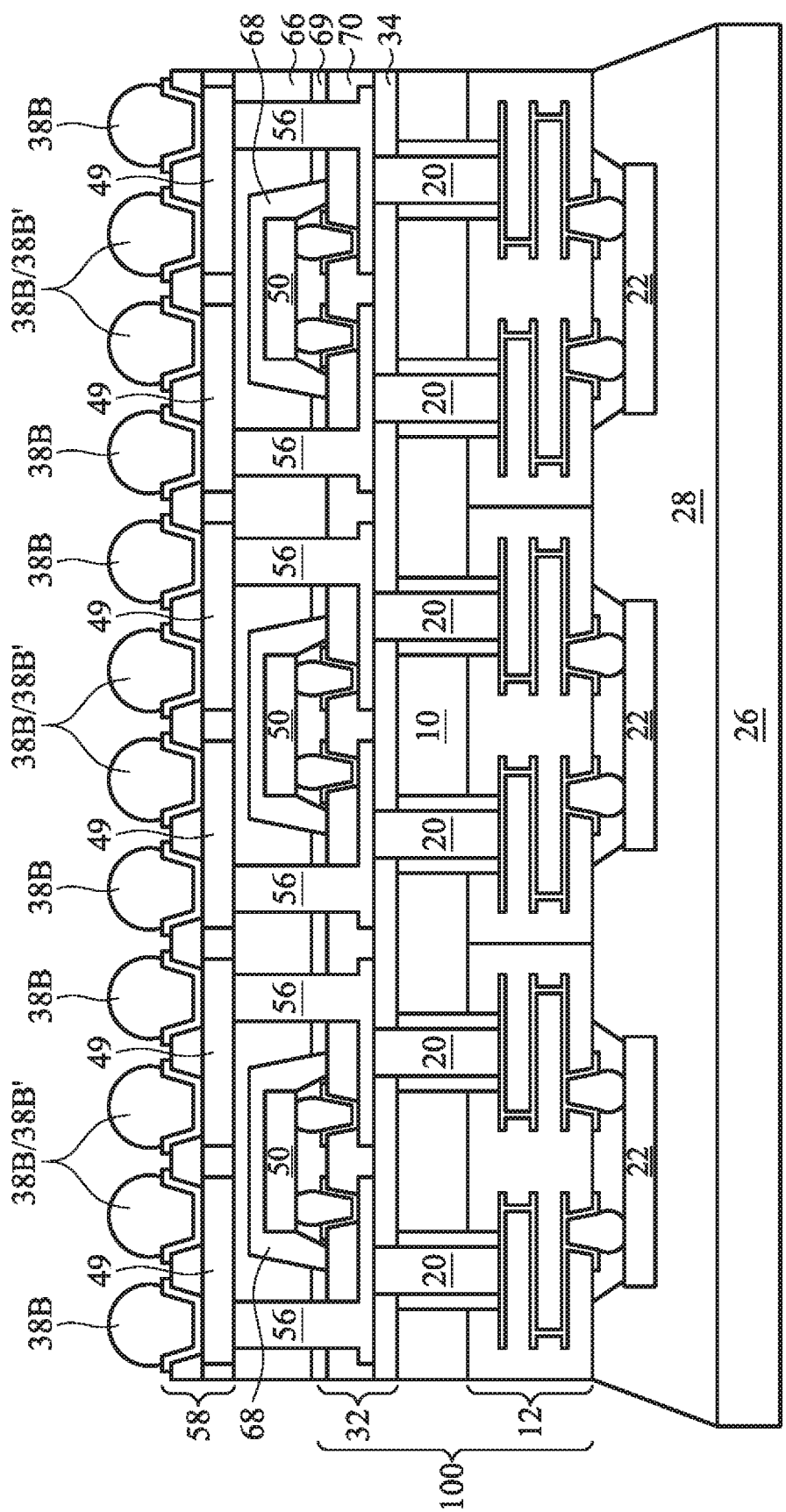
Figure 3C:
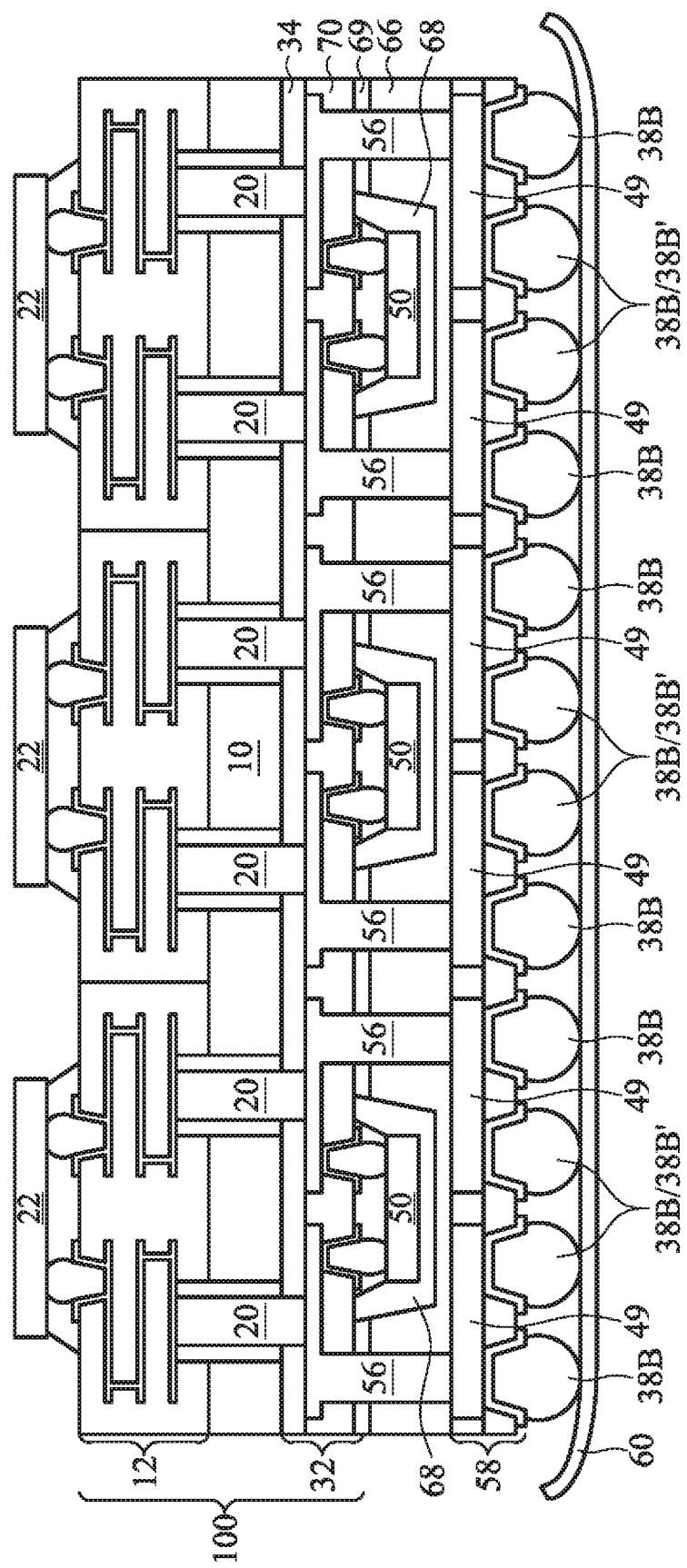

FIGS. 3A through 3C illustrate yet another embodiment, the initial process steps of this embodiment may be essentially the same as shown in FIGS. 1A-1F and FIG. 2A, wherein dies 50 are bonded onto interposer wafer 100. Next, as shown in FIG. 3A, dummy wafer 66 (wherein the material of dummy wafer 66 is also referred to as an encapsulating material) is bonded onto interposer wafer 100. In an embodiment, dummy wafer 66 is a dummy silicon wafer. In alternative embodiments, dummy wafer 66 is formed of other semiconductor materials, such as silicon carbide, GaAs, or the like. Dummy wafer 66 may not have integrated circuit devices, such as capacitors, resistors, varactors, inductors, and/or transistors therein. In yet other embodiments, dummy wafer 66 is a dielectric wafer. Cavities 68 are formed in dummy wafer 66. The size of cavities 68 is great enough to hold dies 50 therein. The bonding of dummy wafer 66 onto interposer wafer 100 may include oxide-to-oxide bonding. In an exemplary embodiment, before dummy wafer 66 is bonded onto interposer wafer 100, oxide layer 69, which may be formed of silicon oxide (such as a thermal oxide) is pre-formed on dummy wafer 66, and oxide layer 70 is pre-formed on interposer wafer 100. Oxide layer 69 is then bonded onto oxide layer 70 through oxide-to-oxide bonding. As a result, dies 50 are embedded in cavities 68, and surface 72 of the resulting structure is flat.

Next, as shown in FIG. 3B, TSVs 56 are formed to penetrate dummy wafer 66 and oxide layers 69 and 70, and are electrically coupled to backside interconnect structure 32. Next, interconnect structure 58, which includes RDLs 49 electrically coupled to TSVs 56, is formed, followed by the formation of UBMs (not marked) and large bumps 38B. Again, large bumps 38B include bumps 38B' formed directly over, and vertically overlapping, dies 50.

In FIG. 3C, carrier 26 is de-bonded. Dicing tape 60 is then adhered to a side of the resulting structure. Next, a dicing is performed to separate interposer wafer 100 and dies 22 and 50 bonded onto interposer wafer 100 into a plurality of dies.

Figure 4A:
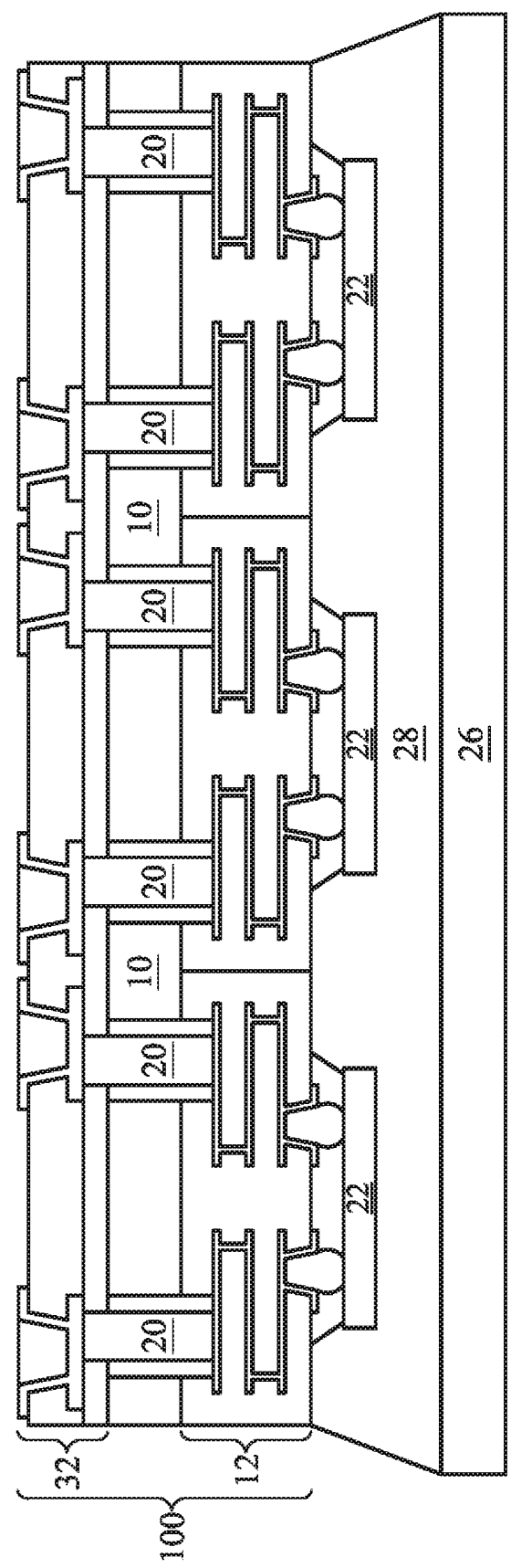
FIGS. 4A through 4E are cross-sectional views of intermediate stages in the manufacturing of a 3DIC in accordance with various embodiments, wherein a die is located in an opening in an interposer.
Figure 4B:
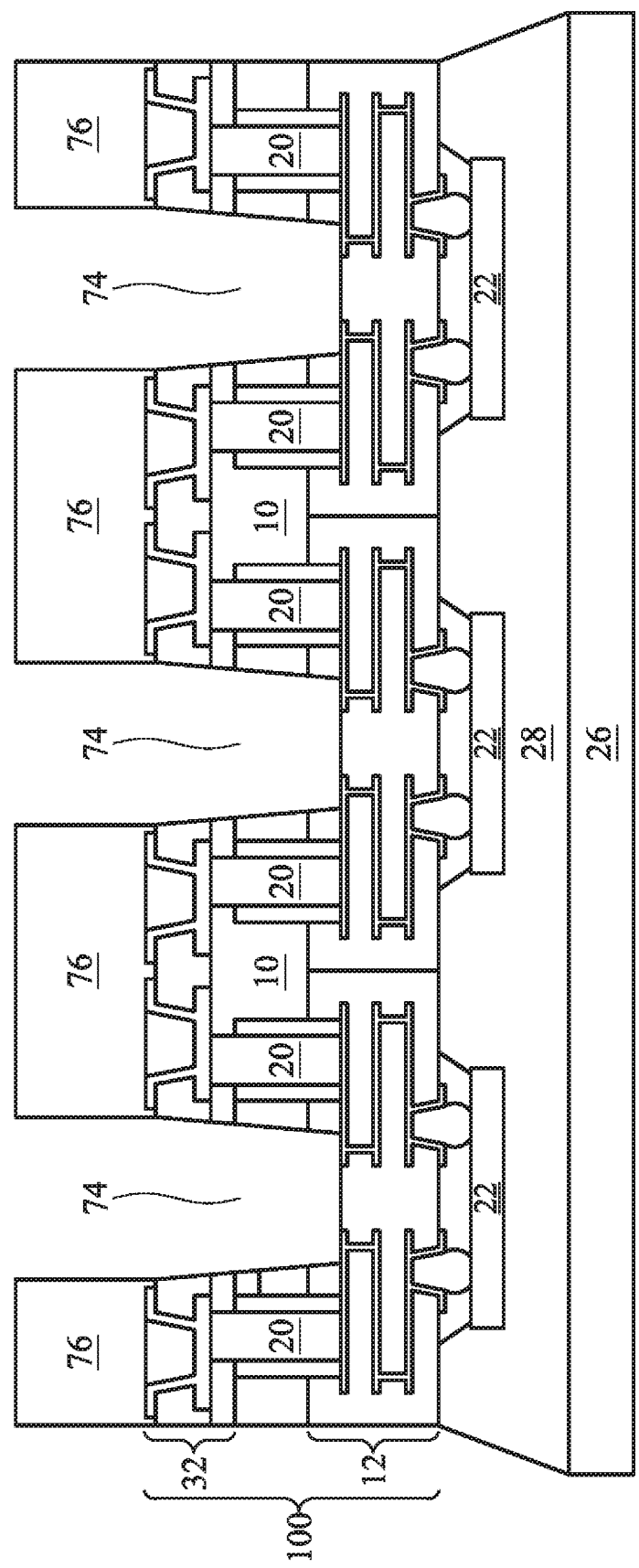

FIGS. 4A through 4D illustrate yet another embodiment, wherein dies 50 are located in the cavities in interposer wafer 100. First, the structure shown in FIG. 4A is formed, wherein the formation process may be essentially the same as shown in FIGS. 1A through 1E. Therefore, the formation details are not discussed herein. Next, as shown in FIG. 4B, openings 74 are formed in interposer wafer 100, for example, using wet etch or dry etch. This may be performed by forming and patterning photo resist 76 and then etching interposer wafer 100 through the openings in photo resist 76. The etch may stop when front-side interconnect structure 12 is reached, or the portions of metal features in front-side interconnect structure 12 are exposed. The exposed metal structures in front-side interconnect structure 12 may act as bond pads.

Figure 4C:
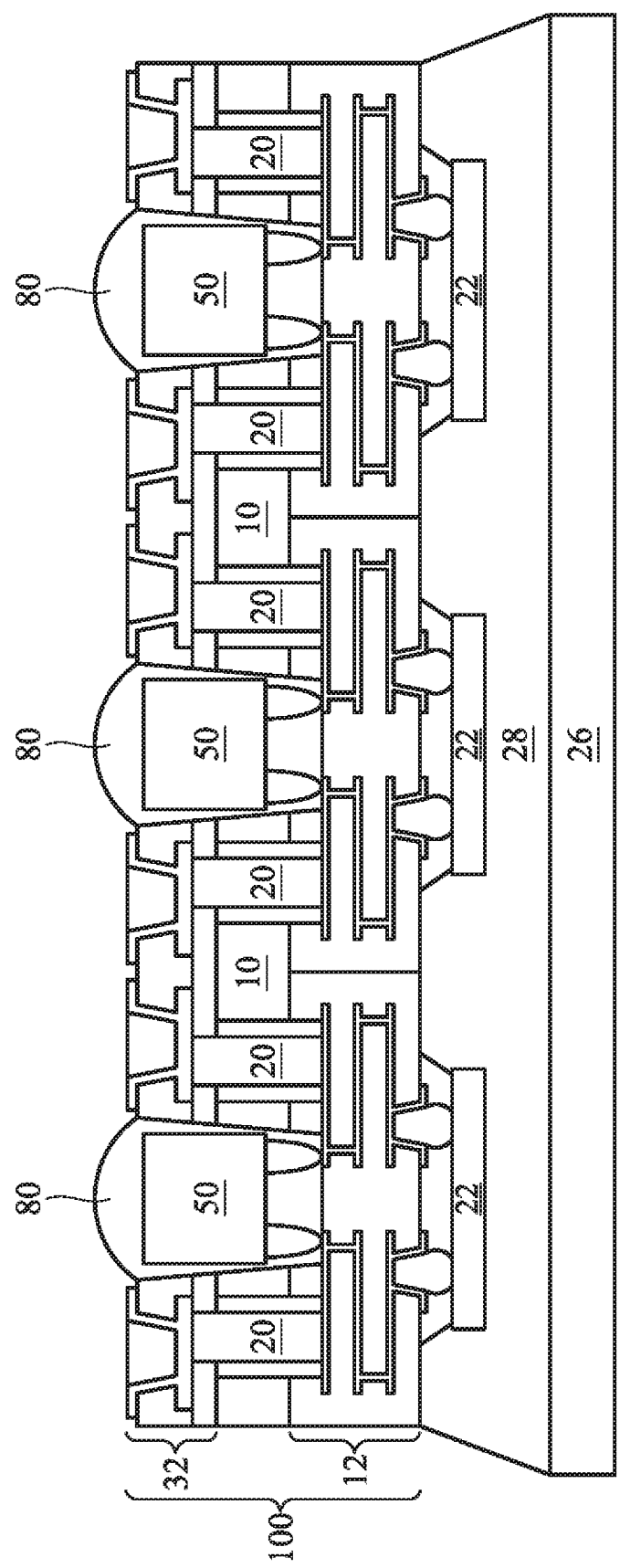

In FIG. 4C, dies 50 are inserted into openings 74 and bonded onto the metal features in front-side interconnect structure 12. The bonding may be solder bonding, metal-to-metal bonding, or the like. Accordingly, dies 50 may be electrically coupled to dies 22 and TSVs 20. Next, underfill 80 is filled into the remaining spaces in openings 74.

Figure 4D:
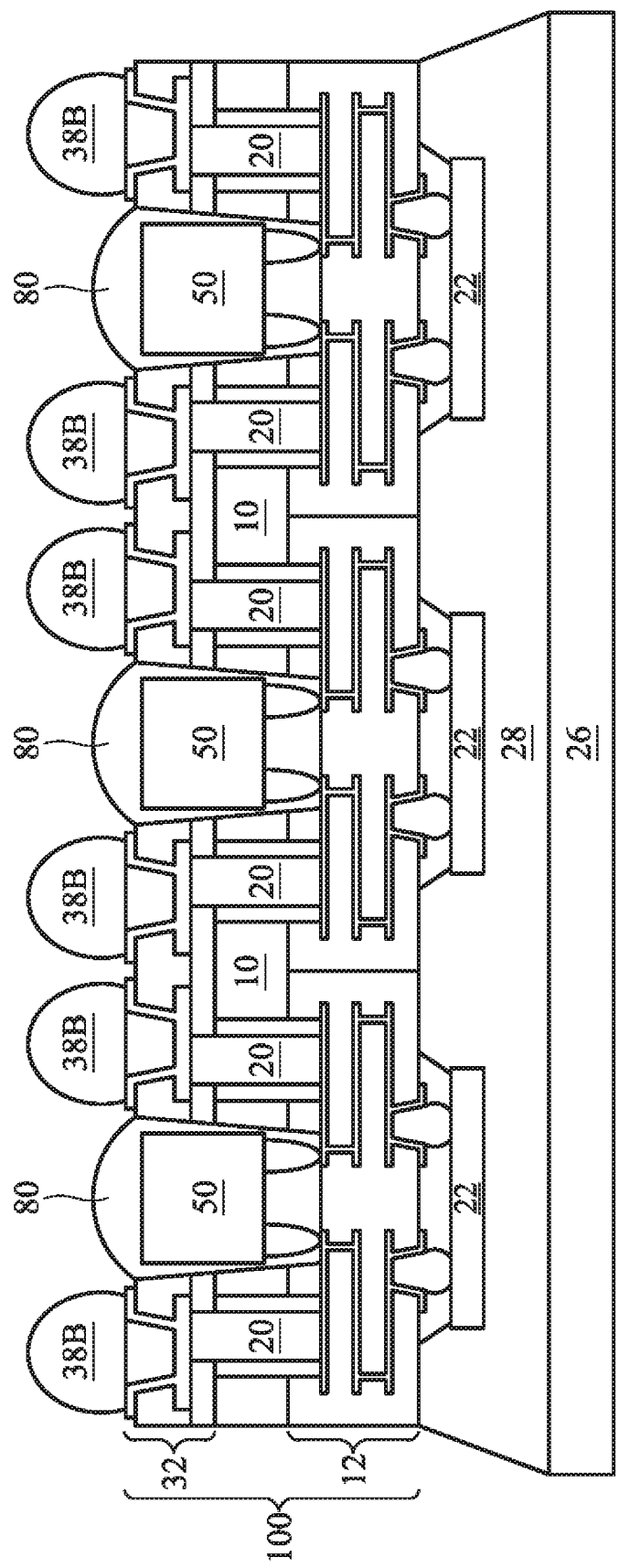
Figure 4E:
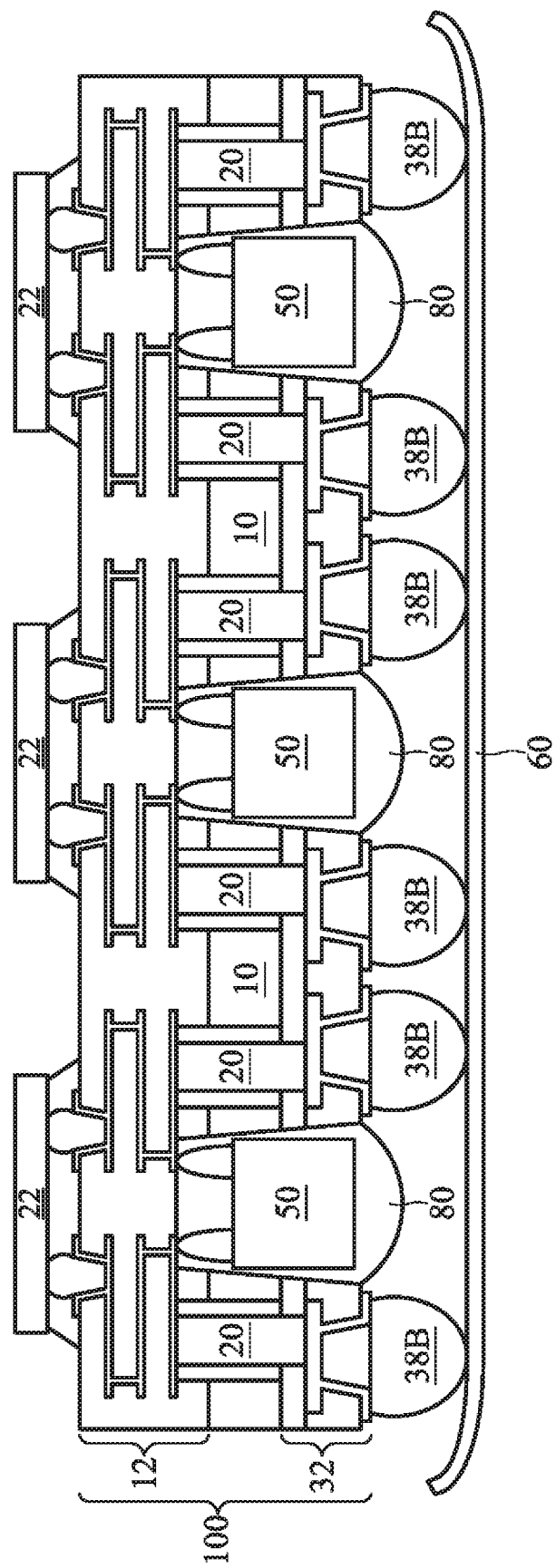

Referring to FIG. 4D, large bumps 38B are formed. In alternative embodiments, large bumps 38B are formed before the formation of openings 74 (FIG. 4B) and the bonding of dies 50. In FIG. 4E, dicing tape 60 is attached, and the 3DIC shown in FIG. 4E may be diced into individual dies.

In alternative embodiments, after the formation of the structure shown in FIG. 4C, molding compound 54 (FIGS. 2B-2D) or dummy wafer 66 (FIGS. 3A-3C) is formed/bonded onto the structure shown in FIG. 4C and on the opposite side of interposer wafer 100 than dies 22. The remaining process steps may be similar to what are shown in FIGS. 2B-2D and FIGS. 3A-3C, and hence are not discussed herein. Further, in each of the above-discussed embodiments, dies 22 may be bonded onto interposer wafer 100 either before or after the bonding of dies 50, and may be bonded after the formation of large bumps 38B.

Figure 5A:
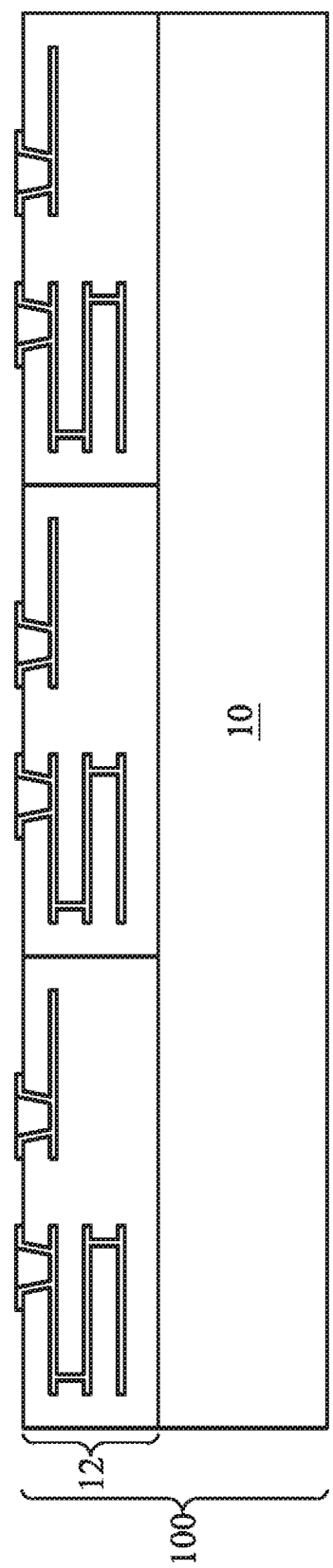
FIGS. 5A through 5D are cross-sectional views of intermediate stages in the manufacturing of a 3DIC in accordance with various embodiments, wherein through-substrate vias in an interposer have different lengths.
Figure 5B:
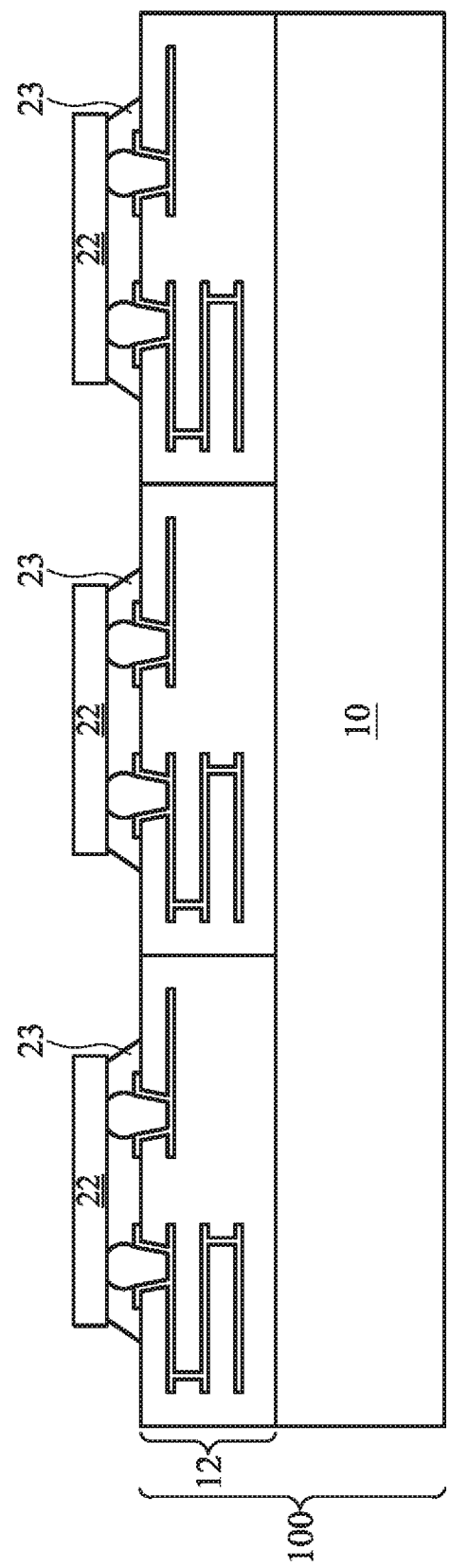

In above-discussed embodiments, TSVs 20 (for example, referring to FIG. 1C) in interposer wafer 100 may have a same length. In alternative embodiments, TSVs 20 may have different lengths. FIGS. 5A through 5D illustrate an exemplary embodiment for forming TSVs 20 with different lengths. Referring to FIG. 5A, substrate 10 of interposer wafer 100 is provided, and interconnect structure 12 is formed over substrate 10. Interconnect structure 12 includes UBMs and bumps (not marked). Next, as shown in FIG. 5B, dies 22 are bonded onto interposer wafer 100, and underfill 23 is also injected into the gaps between dies 22 and interposer wafer 100 and is cured.

Figure 5C:
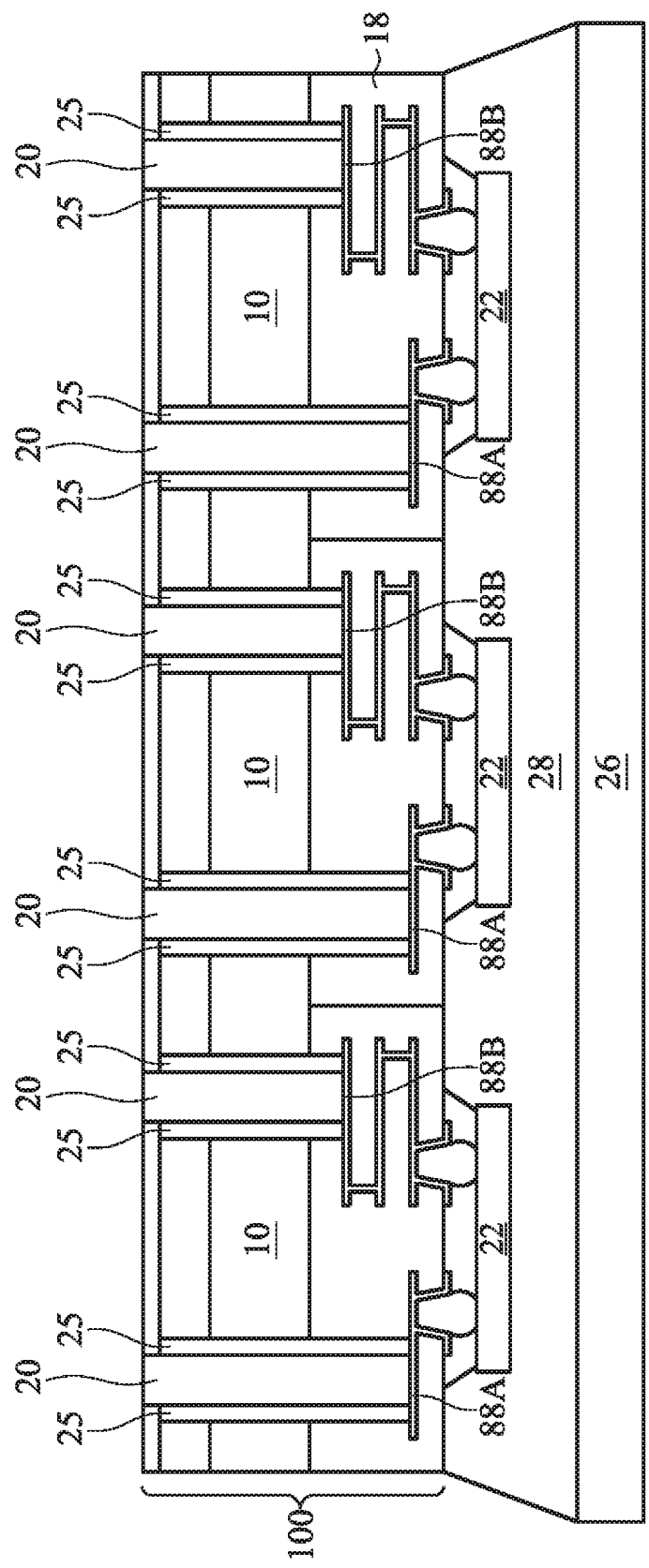
Figure 5D:
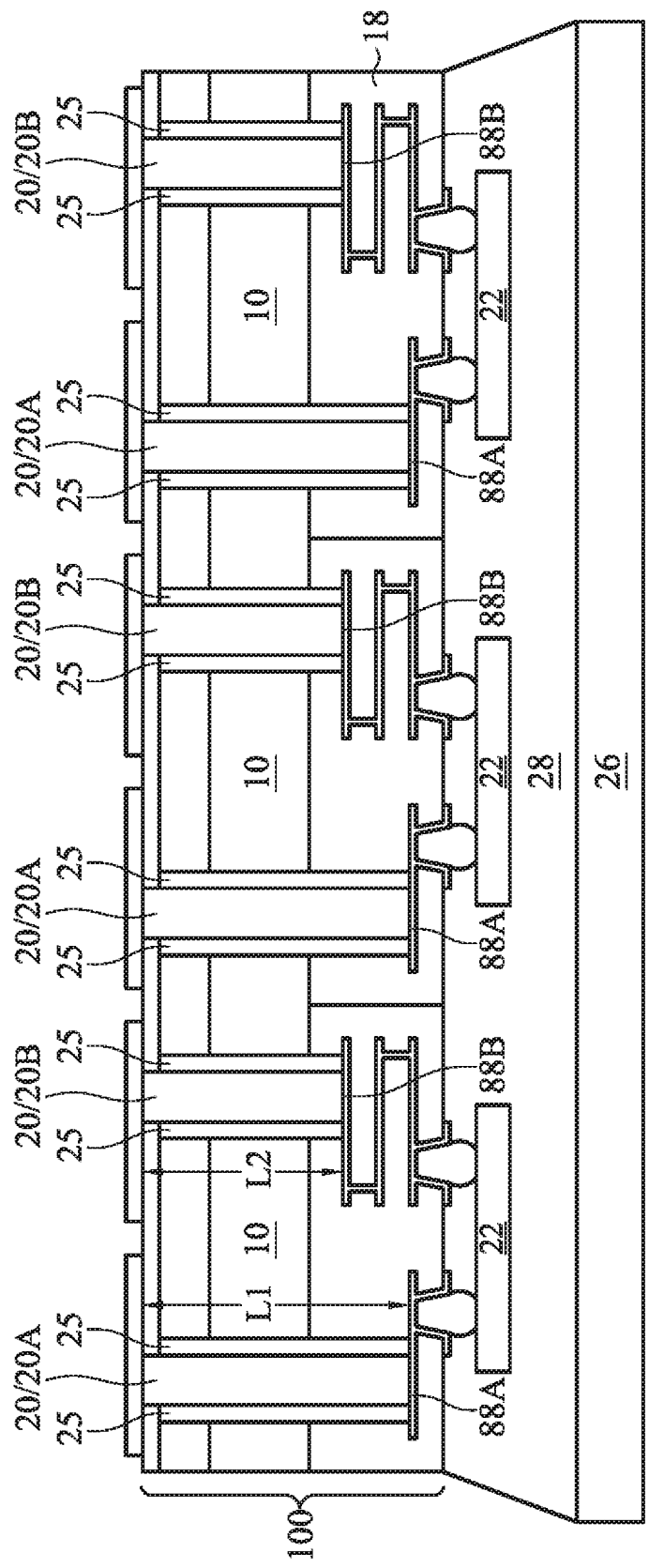

Referring to FIG. 5C, carrier 26, which may be a glass wafer, is bonded onto the front side of interposer wafer 100 through adhesive 28. A wafer backside grinding is performed to thin substrate 10 from the backside to a desirable thickness. Next, TSV openings (occupied by the illustrated TSVs 20) are formed to penetrate substrate 10. Further, the TSV openings extend into dielectric layers 18 that are used for forming interconnect structure 12. The TSV openings are then filled with a metallic material to form TSVs 20 and dielectric layer 25 for electrically insulating TSVs 20 from substrate 10. In the resulting structure, metal features 88 (of interconnect structure 12) include metal features 88A and 88B, with metal features 88A buried deeper inside dielectric layers 18 than metal features 88B. In the formation of the TSV openings, metal features 88A and 88B may be used as etch stop layers, so that the etching of dielectric layers 18 stops at different depths. Accordingly, length L1 (FIG. 5D) of TSVs 20A is greater than length L2 of TSVs 20B. The subsequent process steps may be essentially the same as shown in FIGS. 1E through 1I, or as shown in other embodiments, when applicable.

It is observed that in the embodiments (for example, FIGS. 1I, 2D, 3C, and 4E), no TSVs are needed, although they can be formed, in any of dies 22 and 50. However, the devices in both dies 22 and 50 may be electrically coupled to large bumps 38B and electrically coupled to each other. In conventional 3DICs, TSVs are formed after the formation of the integrated circuit devices in device dies. This results in the increase in the yield loss and the cycle time for packaging. In the embodiments, however, no TSVs are needed in any of device dies 22 and 50, and the possible yield loss resulting from the formation of TSVs in device dies 22 and 50 is avoided. Further, the cycle time is reduced since interposer wafer 100 and the corresponding TSVs may be formed at the time dies 22 and 50 are formed.

Although the embodiments and their advantages have been described in detail, it should be understood that various changes, substitutions, and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method comprising:
   forming a via in a substrate;
   thinning a first side of the substrate to expose a top surface and sidewalls of the via;
   forming a first interconnect structure over the first side of the substrate, the top surface and exposed sidewalls of the via extending into the first interconnect structure;
   etching the first interconnect structure to form a first opening, the first opening extending through the first interconnect structure and the substrate;
   bonding a first die in the first opening; and
   depositing an underfill material filling the first opening and surrounding the first die.

2. The method of claim 1, further comprising forming a second interconnect structure over a second side of the substrate, wherein the first die is bonded to a metal feature of the second interconnect structure.

3. The method of claim 2, wherein the first die is bonded to the metal feature using solder bonding.

4. The method of claim 2, wherein the first die is bonded to the metal feature using metal-to-metal bonding.

5. The method of claim 2, wherein the via extends through a first dielectric layer in the first interconnect structure and a second dielectric layer in the second interconnect structure.

6. The method of claim 2, wherein the via physically contacts the metal feature.

7. A method comprising:
   forming a first interconnect structure over a first side of a substrate, the substrate comprising a via, the via extending through a first dielectric layer of the first interconnect structure to contact a first metal feature of the first interconnect structure;
   forming a second interconnect structure over a second side of the substrate opposite the first side, the via extending through a second dielectric layer of the second interconnect structure to contact a second metal feature of the second interconnect structure;
   etching the second interconnect structure and the substrate to form a first opening exposing the first metal feature; and
   bonding a first die to the first metal feature.

8. The method of claim 7, further comprising forming conductive bumps on the second interconnect structure, wherein the conductive bumps are formed before etching the second interconnect structure and the substrate.

9. The method of claim 7, further comprising forming conductive bumps on the second interconnect structure, wherein the conductive bumps are formed after etching the second interconnect structure and the substrate.

10. The method of claim 7, further comprising bonding a second die to the first interconnect structure opposite the substrate.

11. The method of claim 7, wherein etching the second interconnect structure and the substrate comprises:
    forming a photoresist over the second interconnect structure;
    patterning the photoresist to form a second opening in the photoresist; and
    etching the second interconnect structure and the substrate through the second opening using a dry etch process.

12. The method of claim 7, wherein a fourth dielectric layer is interposed between the via and each of the first dielectric layer, the second dielectric layer, and the substrate.

13. A method of forming a device comprising:
    providing a silicon substrate substantially free from integrated circuit devices;
    forming a via penetrating from a front side of the silicon substrate and reaching a predetermined depth of the silicon substrate;
    forming a first interconnect structure over the front side of the silicon substrate, wherein the first interconnect structure comprises a first dielectric layer and a first metal feature in the first dielectric layer;
    bonding a first die onto the first interconnect structure;
    removing a backside of the silicon substrate to expose an end of the via such that the via forms a through-substrate via (TSV);
    forming a second interconnect structure on the backside of the silicon substrate and electrically coupled to the exposed end of the TSV;
    forming an opening penetrating the second interconnect structure and the silicon substrate to reach a surface of the first interconnect structure; and
    bonding a second die onto the surface of the first interconnect structure in the opening.

14. The method of claim 13, further comprising forming a plurality of solder bumps on the second interconnect structure.

15. The method of claim 13, further comprising forming an underfill material in the opening.

16. The method of claim 15, wherein the underfill material surrounds a top surface, sidewalls, and a bottom surface of the second die.

17. The method of claim 15, wherein a first distance between a first surface of the second die disposed furthest from the silicon substrate and a first surface of the silicon substrate is less than a second distance between a first surface of the second interconnect structure disposed furthest from the silicon substrate and the first surface of the silicon substrate.

18. The method of claim 17, wherein a third distance between a first surface of the underfill material disposed furthest from the silicon substrate and the first surface of the silicon substrate is greater than both the first distance and the second distance.

19. The method of claim 13, wherein forming the via comprises:
    forming a recess in the silicon substrate;
    forming a second dielectric layer in the recess along a bottom surface and sidewalls of the recess; and
    filling the recess with a conductive material to form the via.

20. The method of claim 19, wherein the removing the backside of the silicon substrate to expose an end of the via further comprises removing the second dielectric layer from the end of the via and sidewalls of the via, wherein the end of the via and portions of the sidewalls of the via are exposed after the removing the backside of the silicon substrate to expose an end of the via.

* * * * *